(12) United States Patent
Bassom et al.

(10) Patent No.: US 12,154,763 B2
(45) Date of Patent: Nov. 26, 2024

(54) HYDRAULIC FEED SYSTEM FOR AN ION SOURCE

(71) Applicant: Axcelis Technologies, Inc., Beverly, MA (US)

(72) Inventors: Neil J. Bassom, Hamilton, MA (US); Joshua Abeshaus, Haverhill, MA (US); David Sporleder, Billerica, MA (US); Neil Colvin, Merrimack, NH (US); Joseph Valinski, Newmarket, NH (US); Michael Cristoforo, Beverly, MA (US); Vladimir Romanov, Danville, NH (US); Pradeepa Kowrikan Subrahmnya, Thirthahalli (IN)

(73) Assignee: Axcelis Technologies, Inc., Beverly, MA (US)

(*) Notice: Subject to any disclaimer, the term of this patent is extended or adjusted under 35 U.S.C. 154(b) by 0 days.

(21) Appl. No.: 18/336,337

(22) Filed: Jun. 16, 2023

(65) Prior Publication Data
US 2023/0343558 A1    Oct. 26, 2023

Related U.S. Application Data

(63) Continuation of application No. 17/588,999, filed on Jan. 31, 2022, now Pat. No. 11,728,140.

(51) Int. Cl.
*H01J 37/32* (2006.01)
*H01J 37/08* (2006.01)

(52) U.S. Cl.
CPC ........ *H01J 37/32412* (2013.01); *H01J 37/08* (2013.01)

(58) Field of Classification Search
CPC ........ H01J 37/08; H01J 37/20; H01J 37/3171; H01J 37/3002; H01J 2237/08; H01J 2237/0805
See application file for complete search history.

(56) References Cited

U.S. PATENT DOCUMENTS

| 3,475,636 A | 10/1969 | Eckhardt |
| 5,008,585 A | 4/1991 | Bernardet et al. |

(Continued)

OTHER PUBLICATIONS

International Search Report dated May 2, 2023 for International Application No. PCT/US2023/011835.

(Continued)

*Primary Examiner* — David E Smith
*Assistant Examiner* — Hsien C Tsai
(74) *Attorney, Agent, or Firm* — Eschweiler & Potashnik, LLC

(57) ABSTRACT

An ion source has an arc chamber defining an arc chamber volume. A reservoir is coupled to the arc chamber, defining a reservoir volume. The reservoir receives a source species to define a liquid within the reservoir volume. A conduit fluidly couples the reservoir volume to the arc chamber volume. First and second openings of the conduit are open to the respective reservoir and arc chamber volume. A heat source selectively heats the reservoir to melt the source species at a predetermined temperature. A liquid control apparatus controls a first volume of the liquid within the reservoir volume to define a predetermined supply of the liquid to the arc chamber volume. The liquid control apparatus is a pressurized gas source fluidly coupled to the reservoir to supply a gas to the reservoir and provide a predetermined amount of liquid to the arc chamber.

19 Claims, 6 Drawing Sheets

(56) References Cited

U.S. PATENT DOCUMENTS

| | | |
|---|---|---|
| 11,170,967 B2 | 11/2021 | Bassom et al. |
| 2016/0172164 A1* | 6/2016 | Sweeney .............. H01J 37/3171 |
| | | 250/429 |
| 2020/0090916 A1 | 3/2020 | Patel et al. |
| 2020/0303154 A1* | 9/2020 | Bassom .............. H01J 37/3002 |

OTHER PUBLICATIONS

Notice of Allowance dated Mar. 17, 2023 for U.S. Appl. No. 17/588,999.

* cited by examiner

HYDRAULIC FEED SYSTEM FOR AN ION SOURCE

REFERENCE TO RELATED APPLICATION

This application is a Continuation of U.S. application Ser. No. 17/588,999, filed on Jan. 31, 2022, the contents of which are hereby incorporated by reference in their entirety.

TECHNICAL FIELD

The present invention relates generally to ion implantation systems, and more specifically to apparatuses, systems and methods for providing source material for an ion source.

BACKGROUND

There is increasing demand for ion implants using metal ions. For example, aluminum implants are important for the power device market, which is a small but very fast-growing segment of the market. For many metals, including aluminum, supplying feed material to the ion source is problematic. While gas molecules containing aluminum or other metals may be utilized, the metal atom(s) tend to be attached to numerous carbon and/or hydrogen atoms, which can cause problems in the ion source. Systems have been previously provided that utilize a vaporizer, which is a small oven that is external to the arc chamber of the ion source, whereby metal salts are heated to produce adequate vapor pressure to supply vapor to the ion source. The oven, however, is remote from the arc chamber and takes time to heat up to the desired temperature, establish the vapor flow, start the plasma, start the ion beam, etc. Further, if a change from one metal species to some other species is desired, time is taken in waiting for the oven to cool down adequately for such a change in species so that the vapor from the vaporizer is no longer present in the arc chamber to an appreciable degree.

Another conventional technique is to place a metal-containing material inside the arc chamber. For aluminum implants, the metal-containing material may comprise aluminum oxide, aluminum fluoride, or aluminum nitride, all of which can withstand the approximately 800 C temperatures of the plasma chamber. In such a system, atoms are removed from the metal-containing material, either through sputtering or chemical action, and the atoms enter the plasma. Etchant gases such as fluorine can be further used for chemical etching of the material. While acceptable beam currents can be attained using these various techniques, compounds of aluminum oxide, aluminum chloride, and aluminum nitride, all of which are good electrical insulators, tend to be deposited on electrodes adjacent to the ion source in a relatively short period of time (e.g., 5-10 hours). As such, various deleterious effects are seen, such as high voltage instabilities and associated variations in dosage of ions being implanted.

SUMMARY

Aspects of the disclosure facilitate ion implantation processes for increasing a length of operational use of an ion source in an ion implantation system, reducing a transition time between implantation of various implantation species, and improving a purity of a plasma associated with each implantation species. The disclosure further increases a time between preventive maintenance cycles, thus increasing overall productivity and lifetime of the ion implantation system.

In accordance with one example of the disclosure, an ion source is provided for an ion implantation system, wherein the ion source comprises an arc chamber defining an arc chamber volume. A reservoir is operably coupled to the arc chamber and defines a reservoir volume. The reservoir volume, for example, is configured to contain a source species in the form of a liquid therein. The source species, for example, can be initially provided as a solid source species.

A conduit fluidly couples the reservoir volume to the arc chamber volume. The conduit has a first opening and a second opening, wherein the first opening is operably coupled to the reservoir, and wherein the second opening is elevated from the first opening and open to the arc chamber volume. A liquid control apparatus is further operably coupled to the reservoir, wherein the liquid control apparatus is configured to control a first volume of the liquid defined within the reservoir volume. The first volume of the liquid within the reservoir volume further defines a predetermined supply of the liquid to the arc chamber volume.

The liquid control apparatus, for example, comprises a gas source fluidly coupled to the reservoir, wherein the gas source is configured to selectively supply a gas to the reservoir at a predetermined pressure and/or flow rate. In one example, a gas pressure controller is provided and configured to control a pressure of the gas within the reservoir, wherein the pressure of the gas defines the first volume of the liquid within the reservoir volume.

In another example, the liquid control apparatus further comprises a gas bleed orifice, wherein the gas bleed orifice defines a fluid communication between the reservoir volume and an external environment. The gas bleed orifice, for example, defines a predetermined fluid conductance between the reservoir volume and the external environment. A gas flow controller can be further configured to control a flow rate of the gas to the reservoir, wherein the flow rate and predetermined fluid conductance defines the first volume of the liquid within the reservoir volume. The gas bleed orifice, for example, can be further configured to selectively bleed the gas from the reservoir volume to the external environment at a predetermined flow rate, thereby maintaining the first volume of the liquid within the reservoir volume.

In accordance with one example aspect, a cup is positioned within the arc chamber, wherein the cup defines a cup volume. The second opening of the conduit, for example, is defined in a bottom surface of the cup. The cup, for example, comprises a stem extending from the bottom surface of the cup through a wall of the arc chamber, wherein the conduit is defined within the stem, and wherein the reservoir is positioned beneath the cup. The liquid control apparatus, for example, can control a second volume of the liquid within the cup volume via the control of the first volume of the liquid within the reservoir volume.

In accordance with another example, a repeller apparatus is operably coupled to a bottom portion of the arc chamber, wherein the cup is defined in the repeller apparatus. The repeller apparatus can be electrically coupled to, or electrically isolated from, the arc chamber, whereby the repeller apparatus can be further configured to selectively heat the liquid via a plasma within the arc chamber.

In another example, a heat source is provided in thermal communication with the reservoir, wherein the heat source is configured to selectively heat the reservoir. The heat source, for example, comprises one or more of an electrical cartridge heater operably coupled to the reservoir and a heat lamp. The heat source can comprise any electrical or physical heating apparatus or source, such as electrical heaters, plasma column heating, or other heating source available in the ion source. For example, the arc chamber can comprise a sidewall defining the heat source, wherein the sidewall of the arc chamber is configured to transfer heat associated with a plasma within the arc chamber volume to the reservoir. In a particular example, the reservoir is selectively coupled to the arc chamber, wherein the reservoir volume is configured to selectively receive a solid source species for disposition therein. As such, the heat source can be further configured to melt the solid source species to define the liquid.

In other examples, the liquid control apparatus can comprise one or more of a bladder, a syringe, or a mechanical apparatus configured to mechanically control a size or position of the first volume. For example, the liquid control apparatus can comprise an elevator mechanism operably coupled to the reservoir, wherein the elevator mechanism selectively varies a vertical position of the reservoir with respect to arc chamber to define the predetermined supply of the liquid to the arc chamber volume due to gravitational force.

In accordance with another example aspect of the disclosure, an ion source is provided, wherein the ion source comprises an arc chamber defining an arc chamber volume. A cup is positioned within the arc chamber, wherein the cup defines a cup volume. The cup, for example, comprises a stem extending from a bottom surface of the cup through a wall of the arc chamber. A reservoir is further operably coupled to the arc chamber and defines a reservoir volume, wherein the reservoir volume is configured to contain a liquid therein.

A conduit can be defined in the stem, wherein the conduit fluidly couples the reservoir volume to the arc chamber volume. Further, a heat source is provided in thermal communication with the reservoir, wherein the heat source is configured to selectively heat the reservoir. A liquid control apparatus is also operably coupled to the reservoir. The liquid control apparatus is configured to control a first volume of the liquid defined within the reservoir volume, wherein the first volume of the liquid within the reservoir volume further defines a second volume of the liquid within the cup volume.

The liquid control apparatus, for example, can comprise a pressurized gas source fluidly coupled to the reservoir. The pressurized gas source in this example is configured to selectively supply a gas to the reservoir. A gas bleed orifice, for example, defines a predetermined fluid conductance between the reservoir volume and an external environment, whereby a gas flow controller is configured to control a flow rate of the gas to the reservoir, and wherein the flow rate and predetermined fluid conductance defines the first volume of the liquid within the reservoir volume.

The reservoir, for example, can be selectively coupled to a bottom portion of the arc chamber, wherein the reservoir volume is configured to selectively receive a solid source species for disposition therein, and wherein the heat source is configured to melt the solid source species to define the liquid.

In accordance with yet another example aspect, an ion source for an ion implantation system is provided, wherein the ion source comprises an arc chamber defining an arc chamber volume. A reservoir is selectively operably coupled to a bottom portion of the arc chamber and defining a reservoir volume, wherein the reservoir is configured to selectively receive a solid source species for disposition within the reservoir volume. A repeller apparatus is further operably coupled to the arc chamber, wherein the repeller apparatus comprises a cup defining a cup volume. The repeller apparatus, for example, comprises a stem extending from a bottom surface of the cup through the bottom portion of the arc chamber, whereby a conduit is defined within the stem, and wherein the conduit fluidly couples the reservoir volume to the arc chamber volume. A heat source is further provided in thermal communication with the reservoir, wherein the heat source is configured to selectively heat the reservoir and to melt the solid source species to define a liquid.

A liquid control apparatus is further operably coupled to the reservoir in this example aspect, wherein the liquid control apparatus is configured to control a first volume of the liquid defined within the reservoir volume. The first volume of the liquid within the reservoir volume, for example, further defines a second volume of the liquid within the cup volume. The liquid control apparatus, for example, can comprise a pressurized gas source fluidly coupled to the reservoir, wherein the pressurized gas source is configured to selectively supply a gas to the reservoir. A gas bleed orifice, for example, defines a predetermined fluid conductance between the reservoir volume and an external environment, whereby a gas flow controller controls a flow rate of the gas to the reservoir. The flow rate of the gas and the predetermined fluid conductance, for example, thus defines the first volume of the liquid within the reservoir volume.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
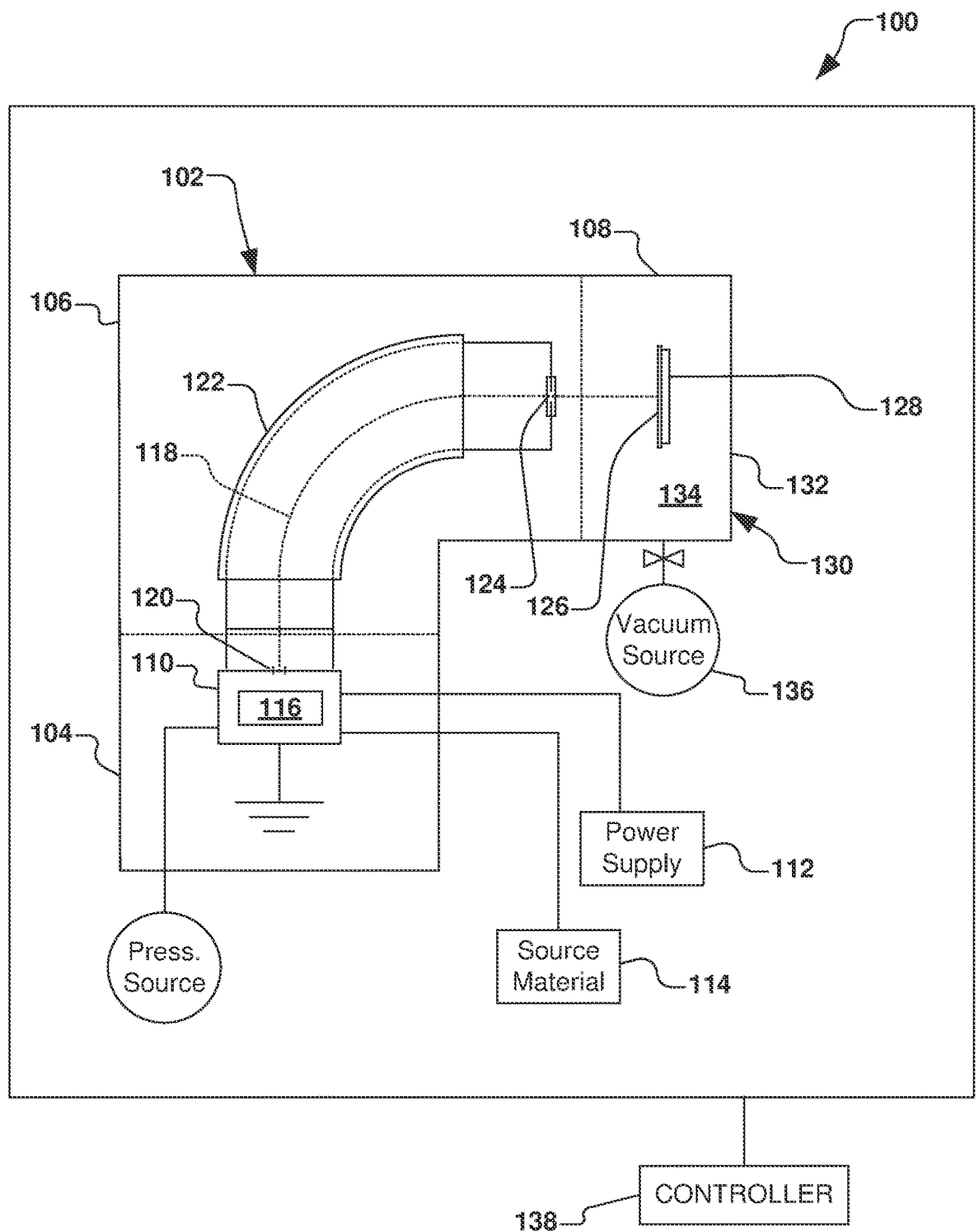
FIG. 1 is a block diagram of an exemplary vacuum system in accordance with several aspects of the present disclosure.

The present disclosure is directed generally toward various apparatuses, systems, and methods associated with implantation of ions into a workpiece. More specifically, the present disclosure is directed to an ion source configured to provide a liquid metal within an arc chamber for extraction of ions therefrom.

Accordingly, the present invention will now be described with reference to the drawings, wherein like reference numerals may be used to refer to like elements throughout. It is to be understood that the description of these aspects is merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features, circuits, or components in one embodiment, and may also or alternatively be fully or partially implemented in a common feature, circuit, or component in another embodiment. Further, several functional blocks, for example, may be implemented as software running on a common processor or controller.

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the workpiece with impurities of a specified dopant material, at a predetermined energy level, and in controlled concentration, to produce a desired semiconductor material during fabrication of an integrated circuit. When used for doping a semiconductor wafer, for example, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

An ion implanter includes an ion source, an ion extraction device, a mass analysis device, a beam transport device and a workpiece processing device. The ion source generates ions of desired atomic or molecular dopant species. These ions are extracted from the ion source by an extraction system, such as a set of electrodes which energize and direct the flow of ions from the ion source, forming an ion beam. Desired ions are separated from the ion beam in a mass analysis device, such as a magnetic dipole that performs mass dispersion or separation of the extracted ion beam. The beam transport device, such as a vacuum system containing a series of focusing devices, transports the ion beam to the workpiece processing device while maintaining desired properties of the ion beam. Finally, workpieces such as semiconductor wafers are transferred in to and out of the workpiece processing device via a workpiece handling system, which may include one or more robotic arms for placing a workpiece to be treated in front of the ion beam and removing the treated workpiece from the ion implanter.

The present disclosure appreciates an interest exists in novel species for use in ion implantation. For example, various non-traditional elements are being explored for use in ion implantation, such as gallium (Ga), aluminum (Al), indium (In), lanthanum (La), tin (Sn) and selenium (Se), where these non-traditional elements share some common attributes. For example, convenient and simple gaseous compounds containing such elements are not readily available, and the elements have melting temperatures that are similar to temperatures commonly found in the vicinity of an ion source of an ion implanter (e.g., room temperature up to approximately 900 C). Further, the melted elements typically have a low vapor pressure (e.g., less than several mtorr) at such temperatures associated with the ion source.

Two general approaches have been conventionally utilized to generate ions from such species; namely, vaporizers and solid targets. For example, if a suitable salt or other compound containing the element exists, it may be first heated in an oven in order to vaporize the element to its gaseous phase, and the vapor can be subsequently fed into the ion source chamber via a communicating channel connecting the oven to the ion source chamber. Such an oven is commonly used when aluminum is selected as the ion species, whereby compounds such as aluminum iodide ($AlI_3$) or aluminum chloride ($AlCl_3$) may be utilized with the vaporizer. However, vaporizers generally have long warm-up and cool-down times, whereby extensive amounts of time (e.g., on the order of 20-30 minutes) can be taken to melt and/or vaporize the compound prior to the resultant vaporized material being fed into the ion source chamber, as well as a similar amount of time to transition to cool down, as no valving is typically present in the communicating channel between the oven and the ion source chamber.

Further, the material vaporized from the compounds can contain undesirable atoms, such as fluorine (F), chlorine (Cl) and oxygen (O), where the undesirable atoms can deleteriously reduce beam current and/or coat electrically active components of the ion implanter with by-products, thus potentially causing instabilities and shortening a lifetime of the ion source.

The other approach for generating ions from such species is to identify a compound of the element having a high melting point, and providing the compound as a solid target within the ion source. For example, for aluminum ion species, a target of aluminum nitride (AlN) or aluminum oxide ($Al_2O_3$) is known to not melt at typical ion source temperatures. Such a target can be placed within the ion source chamber, where the target can be either held in the plasma column, located in a pocket in a sidewall of the ion source chamber, or held in the repeller of the ion source. Atoms of the desired element can then be brought into the plasma via physical sputtering or chemical etching of the target by a plasma generated in the ion source. Such approaches, however, are limited by the physical amount of solid source material that can be contained within the ion source, as well as that the additional atoms present in the target can reduce beam current or shorten the lifetime of the ion source by generating undesirable byproducts.

The present disclosure appreciates that efforts have been made by using material that is held inside a cup-shaped repeller within the arc chamber, where the repeller is covered by a cap having holes penetrating through the cap, such as disclosed in co-owned U.S. Pat. No. 11,170,967, the contents of which are herein incorporated by reference in its entirety. Such an approach uses a combination of vaporization of the material to supply a gas, and surface tension to draw the liquid to the surface of the cap to be exposed to the plasma in order to feed liquid material directly into the ion source chamber. Such an approach has demonstrated high current capabilities. However, the amount of material that can be held in the cup is limited, and control of the flow of the liquid is difficult and is influenced by the plasma parameters. Further, it may be difficult to halt the flow of material from the cup if a different species is desired to be run, and such an approach is best suited to systems where an axis defined between the cathode and repeller is vertical.

The present disclosure appreciates a desire to provide a system, apparatus, and method to control an introduction or flow of a pure element into an ion source from a reservoir having a large capacity, where the reservoir is large enough to last at least a lifetime of the ion source, and wherein a fast-switching capability is provided for changing between different ion species.

In order to gain a general understanding and context of the invention, FIG. 1 illustrates an exemplary vacuum system 100. The vacuum system 100 in the present example comprises an ion implantation system 102, however various other types of vacuum systems are also contemplated, such as plasma processing systems, or other semiconductor processing systems. The ion implantation system 102, for example, comprises a terminal 104, a beamline assembly 106, and an end station 108.

Generally speaking, an ion source 110 in the terminal 104 is coupled to a power supply 112, whereby a supply of source material 114 (also called a dopant material) is provided to an arc chamber 116 and is ionized into a plurality of ions to form and extract an ion beam 118 through an extraction aperture 120. The ion beam 118 in the present example is directed through a beam-steering apparatus 122 (also called a source magnet), and out an aperture 124 towards the end station 108. In the end station 108, the ion beam 118 bombards a workpiece 126 (e.g., a semiconductor such as a silicon wafer, a display panel, etc.), which is selectively clamped or mounted to a chuck 128 (e.g., an electrostatic chuck or ESC). Once embedded into the lattice of the workpiece 126, the implanted ions change the physical and/or chemical properties of the workpiece. Because of this, ion implantation is used in semiconductor device fabrication and in metal finishing, as well as various applications in materials science research.

The ion beam 118 of the present disclosure can take any form, such as a pencil or spot beam, a ribbon beam, a scanned beam, or any other form in which ions are directed toward end station 108, and all such forms are contemplated as falling within the scope of the disclosure.

According to one exemplary aspect, the end station 108 comprises a process chamber 130, such as a vacuum chamber 132, wherein a process environment 134 is associated with the process chamber. The process environment 134 generally exists within the process chamber 130, and in one example, comprises a vacuum produced by a vacuum source 136 (e.g., a vacuum pump) coupled to the process chamber and configured to substantially evacuate the process chamber. Further, a controller 138 is provided for overall control of the vacuum system 100 and components, thereof.

It shall be understood that the systems, apparatuses, and methods of the present disclosure may be implemented in other semiconductor processing equipment such as CVD, PVD, MOCVD, etching equipment, and various other semiconductor processing equipment, and all such implementations are contemplated as falling within the scope of the present disclosure. The present disclosure provides systems, apparatuses, and methods to advantageously increase the length of usage of the ion source 110 between preventive maintenance cycles, and thus increasing overall productivity and lifetime of the vacuum system 100.

Figure 2:
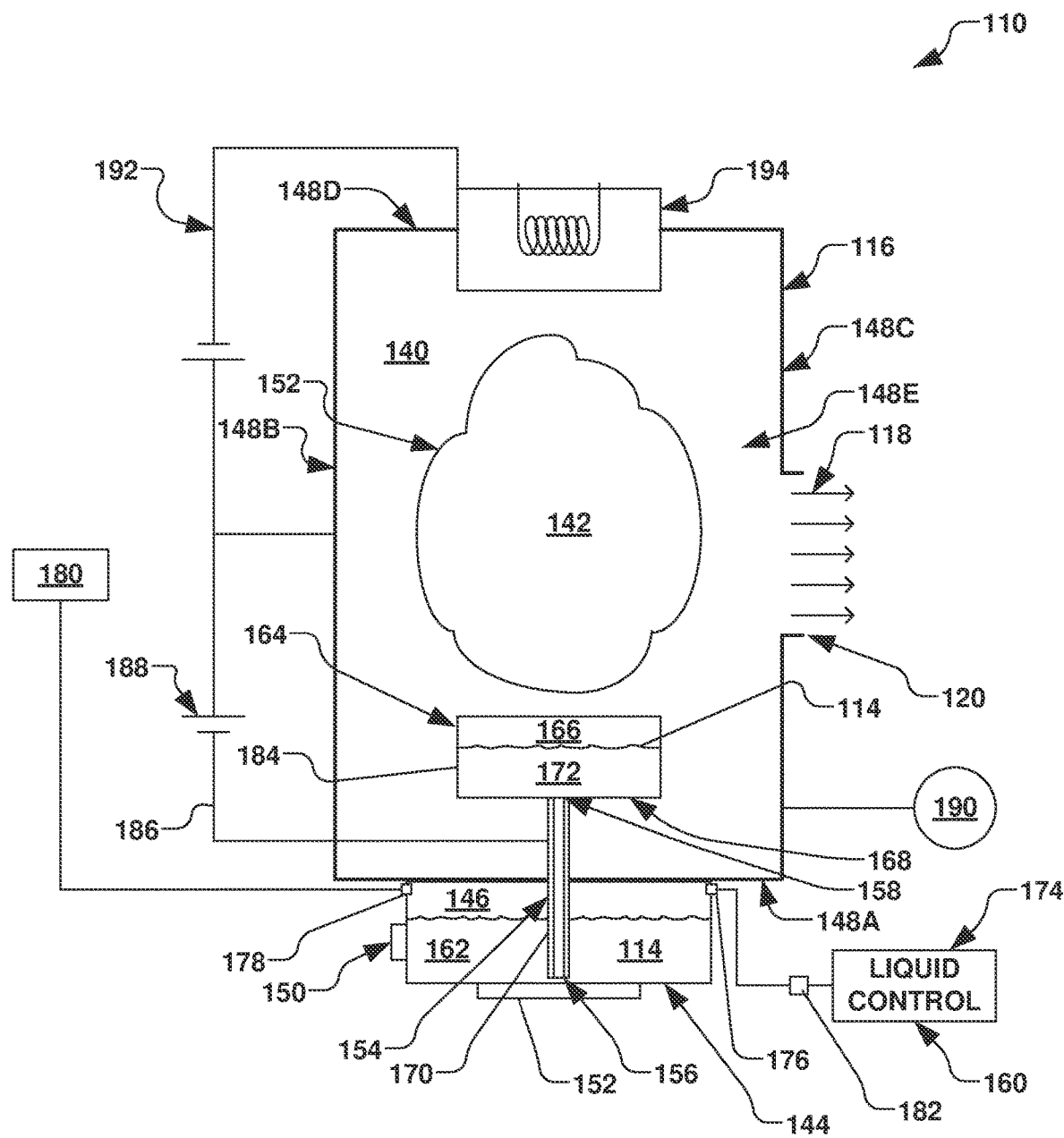
FIG. 2 is a schematic representation of an ion source in accordance with various examples of the present disclosure.

The arc chamber 116 of the ion source 110, for example, is schematically illustrated in FIG. 2, whereby the ion source of the present disclosure can be configured to provide the ion beam 118 of FIG. 1, whereby a high beam current is attained by supplying the source material 114 to the arc chamber 116 in a pure, elemental, and solid form, in a novel manner, as opposed to providing a gaseous compound or solid target, as conventionally seen. For example, in accordance with the present disclosure, the source material 114 can be initially provided to the ion source 110 of FIG. 2 in solid form, and can be comprised of elemental aluminum, indium, gallium, lanthanum, tin, antimony, or other element that is useful for ion implantation. For example, either a pure elemental material may be used, or an alloy may be preferred if the alloy has a more convenient melting temperature. It is noted further that while the source material 114 is described in one example as being an elemental metal, it is noted that the source material can comprise any metallic or non-metallic element, combination elements or compounds, and any such source material is contemplated as falling within the scope of the present disclosure.

As illustrated in FIG. 2, the arc chamber 116 generally defines an arc chamber volume 140 in which a plasma 142 is formed from the source material 114. In accordance with one example embodiment, a reservoir 144 (e.g., a crucible) is operably coupled to the arc chamber 116, wherein the reservoir generally defines a reservoir volume 146. The reservoir 144, for example, is configured to contain the source material 114 in a liquid form within the reservoir volume 146.

The reservoir 144, for example, is further selectively coupled to one or more sidewalls 148A-148E of the arc chamber 116. In the present example, the reservoir 144 is operably coupled to a bottom sidewall 148A of the arc chamber 116. It should be noted, however, that the present disclosure contemplates the reservoir 144 being operably coupled to any of the one or more sidewalls 148A-148E (e.g., bottom, top, left, right, front, back, or other wall) of the arc chamber 116, whereby the reservoir can be directly or indirectly coupled to the one or more sidewalls, and can be either stationary or translational with respect to the arc chamber.

The reservoir volume 146, for example, is selectively accessible for selective placement and enclosure of the source material 114 (e.g., in solid form), therein. For example, one or more securement apparatuses 150 (e.g., one or more bolts, latches, screws, levers, plates, or other coupling devices) can be provided to selectively access the reservoir volume 146, such as to selectively operably couple the reservoir 144 to the arc chamber 116. In the present example, the reservoir 144 can be selectively removed from the arc chamber 116, whereby the source material 114 can be placed within the reservoir volume, and then the reservoir can again be coupled to the arc chamber.

In one example, a heat source 152 is further provided in thermal communication with the reservoir 144. The heat source 152, in one example, is controllable and configured to selectively heat the reservoir to a predetermined temperature associated with the source material 114 being in a liquid state. The predetermined temperature, for example, can be based on the selection of the source material 114, whereby the predetermined temperature is at or greater than a melting point of the selected source material 114 placed within the reservoir volume 146.

The heat source 152, for example, can comprise one or more electrical heaters operably coupled to the reservoir 144, as will be discussed in greater detail, infra. It is noted that the present disclosure contemplates the heat source 152 as comprising any source of heat, such as radiative heat lamps, a heat pump, heat associated with the plasma 142 formed within the arc chamber 116, or any other heating apparatus in thermal communication with the reservoir 144. The reservoir 144, for example, can be thermally coupled to the arc chamber 116, whereby heat associated with the plasma 142 provides heating of the source material 114 within the reservoir. As such, the arc chamber 116, itself, can act as the heat source 152, whereby the formation of the plasma 142 selectively heats the reservoir 144 via thermal conduction through the bottom sidewall 148A of the arc chamber. In another example, the coupling of the reservoir 144 to the arc chamber 116 can advantageously augment heating provided by the above-described electrical heaters such that the source material 114 within the reservoir 144 is heated to, or maintained in, the liquid state.

The present disclosure further appreciates that, based on the selection of source material 114 and an ambient temperature of an environment associated with the terminal 104 of FIG. 1, the heat source 152 can be omitted. As such, the source material 114 can be provided as a liquid within the reservoir 144, whereby no additional heating of the source material is needed to maintain the liquid state. The source material 114, for example, can comprise gallium, indium, or other material having a melting temperature that is close to room temperature, whereby additional heating is not needed to maintain the source material in the liquid state.

In accordance with another example, FIG. 2 illustrates a conduit 154 fluidly coupling the reservoir volume 146 to the arc chamber volume 140. For example, the conduit 154 comprises a first opening 156 and a second opening 158, wherein the first opening is operably coupled to the reservoir 144 and open to the reservoir volume 146, and wherein the second opening is vertically elevated from the first opening and open to the arc chamber volume 140.

A liquid control apparatus 160, for example, is further operably coupled to the reservoir 144, wherein the liquid control apparatus is configured to control a first volume 162 of the source material 114 defined within the reservoir volume 146 when the source material is in the liquid state. The control of the first volume 162 of the source material 114 within the reservoir volume 146, for example, defines a predetermined supply of the source material to the arc chamber volume 140 via a transfer of the source material from between the first opening 156 and the second opening 158 of the conduit 154. The source material 114 is further vaporized within the arc chamber 116 for forming the plasma 142. The source material 114, for example, is exposed directly to an arc chamber volume 140.

In one example, a cup 164 is further positioned within the arc chamber 116, wherein the cup defines a cup volume 166 that is generally exposed to the arc chamber volume 140. The second opening 158 of the conduit 154, for example, is defined in a bottom surface 168 of the cup 164 and opens to the cup volume 166, whereby the source material can be further between the reservoir volume 146 and the cup volume 166 via the liquid control apparatus 160. For example, the cup 164 comprises a stem 170 extending from the bottom surface 168 of the cup through the bottom sidewall 148A of the arc chamber 116, wherein the conduit 154 is defined within the stem, and wherein the reservoir 144 is positioned beneath the cup. The liquid control apparatus 160, for example, thus controls a second volume 172 of the source material 114 within the cup 164 volume via the control of the first volume 162 of the source material within the reservoir volume 146.

In accordance with one example, the liquid control apparatus 160 comprises a pressurized fluid source 174 fluidly coupled to the reservoir 144. The pressurized fluid source 174, for example, is configured to selectively supply a fluid, such as gas, to the reservoir 144 at a predetermined pressure and/or flow through a feed orifice 176 associated with the reservoir, wherein the pressure in the reservoir 144 defines the first volume 162 of the source material 114 within the reservoir volume 146. The liquid control apparatus 160, for example, can thus further control the second volume 172 of the source material 114 within the cup volume 166 via a pressure differential between the pressurized fluid source 174 and a pressure within the arc chamber volume 140. In a preferred embodiment, the fluid supplied by the pressurized fluid source 174 comprises an inert gas such as argon or another gas. However, the present disclosure further contemplates the pressurized fluid source supplying any fluid (e.g., a gas or a liquid) that is non-reactive with the source material 114 and is generally not deleterious to the desired formation and/or composition of the ion beam 118.

A gas bleed orifice 178, for example, can be further provided in association with the reservoir 144, wherein the gas bleed orifice defines a fluid communication between the reservoir volume 146 and an external environment 180. The external environment 180, for example, can be associated with an environment external to the arc chamber 116 or with the arc chamber volume 140 within the arc chamber 116. The gas bleed orifice 178, for example, is further configured to selectively bleed the gas from the reservoir volume 146 to the external environment 180, thereby controlling the first volume 162 of the liquid within the reservoir volume. As such, a control of the second volume 172 of the source material 114 within the cup 164 can be further controlled via the pressure differential between the pressurized fluid source 174, the pressure within the arc chamber volume 140, and a flow of the gas through the gas bleed orifice 178.

The gas bleed orifice 178, for example, can be sized to define a predetermined gas conductance between the reservoir volume 146 and the external environment 180. For example, the ion source 110 and/or ion implantation system 102 of FIG. 1 can be configured to have an acceptable tolerance of approximately 1 sccm of additional gas flow into the system before suffering deleterious results due to pressure or material changes in the system. As such, the gas bleed orifice 178 can be sized to provide less than the aforementioned 1 sccm of gas flow to provide the predetermined gas conductance from the reservoir volume 146 and the external environment 180 without resulting in deleterious effects in the remainder of the system.

Accordingly, in the present example, the liquid control apparatus 160 can further comprise a flow controller 182 (e.g., a mass flow controller) configured to control a flow of the gas that is fed into the reservoir volume 146 from the pressurized fluid source 174, whereby the gas is bled through the gas bleed orifice 178. Based on the predetermined gas conductance associated with the gas bleed orifice, the flow controller 182 can thus advantageously control a pressure differential between the reservoir volume 146 and the external environment 180, thus driving a flow of the source material 114 between the first volume 162 and the second volume 172.

For example, for a given size of the gas bleed orifice 178, the pressure within the reservoir volume 146 is controlled via a control the flow of the gas into the reservoir volume. If the pressure within the reservoir volume 146 is greater than a predetermined acceptable pressure, the flow rate of the gas can be lowered via the flow controller 182, to permit excessive gas to bleed or leak through the bleed orifice 178 until the predetermined acceptable pressure is reached. The vacuum source 136 of FIG. 1, for example, can further remove the excessive gas from the system.

The present disclosure, for example, further provides for removal of the source material 114 from the second volume 172 within the cup 164 of FIG. 2, whereby halting or lowering the flow rate of the gas via the flow controller 182 can expeditiously empty or transfer the source material from the second volume into the first volume 162 (e.g., over a period of a few seconds), whereby the gas will further freely escape from the reservoir 144 through the bleed orifice 178.

It shall be noted that the present disclosure further contemplates controlling the pressure within the reservoir volume 146 to control the second volume 172 of the source material 114 within the cup 164, whereby the bleed orifice 178 is eliminated, and wherein the pressure is controlled by a pressure controller (not shown) in place of the flow controller 182.

According to another example aspect of the disclosure, the cup 164 further defines, or is a component of, a repeller apparatus 184 operably coupled to the arc chamber 116. The repeller apparatus 184, for example, can be negatively biased with respect to the arc chamber 116 by a bias voltage 186 (e.g., 0-500V) provided by a repeller power supply 188. For example, the bias voltage 186 (e.g., a repeller supply voltage) can be altered in response to changes in arc current, extraction current, or other factors for control purposes. The controller 138 of FIG. 1, for example, can control the bias voltage 186, input parameters to the source magnet 122, and/or other parameters associated with the plasma 142 of FIG. 2, whereby an amount of power from the plasma can be controlled and provided to the source material 114 within the cup 164, thus raising its temperature high enough for a vapor pressure to sustain the plasma within the arc chamber 116.

A support gas 190, for example, can be optionally introduced to the arc chamber 116 to further sustain the plasma 142, whereby the support gas may be inert (e.g., argon) or chemically reactive (e.g., fluorine, chlorine) with the source material 114. The support gas 190, for example, can further increase efficiency of the ion source 110 by sputtering material that condenses on one or more walls 148 (also called sidewalls) that generally enclose the arc chamber 116 and convert the sputtered material back into the plasma 142. The bias voltage 186, for example, can be further provided, controlled, or augmented by an arc voltage 192 (e.g., 0-150V) applied to a cathode 194 associated with the arc chamber 116.

Thus, in accordance with various aspects of the disclosure, the heat source 152, comprising heat associated with the arc chamber 116 of the ion source 110 and/or an additional heater, is configured to melt and/or maintain a liquid state of the source material 114 comprising the desired element for ionization in the reservoir 144 that is positioned proximate to the arc chamber, whereby hydrostatic pressure associated with the liquid control apparatus 160 is utilized to introduce the desired element into the arc chamber at a controlled rate. The present disclosure, for example, advantageously reduces material waste when a changeover from one ion species to another, as reducing a pressure provided by the liquid control apparatus 160 can relatively quickly control the second volume 172 of source material 114 that is provided within the arc chamber volume 140, as the source material will flow (e.g., by gravity) from the cup 164 through the conduit 154 and back into the reservoir 144, thus depleting the second volume 172 to zero. As such, when it is desired to change operation of the ion source 110 from a first species of source material 114 to a second species of source material, wasteful use of the first species of source material can be avoided, and the output of the second species of source material can be maximized, as the substantially none of the first species of source material will be present in the plasma 142 upon changeover of species.

Figure 3A:
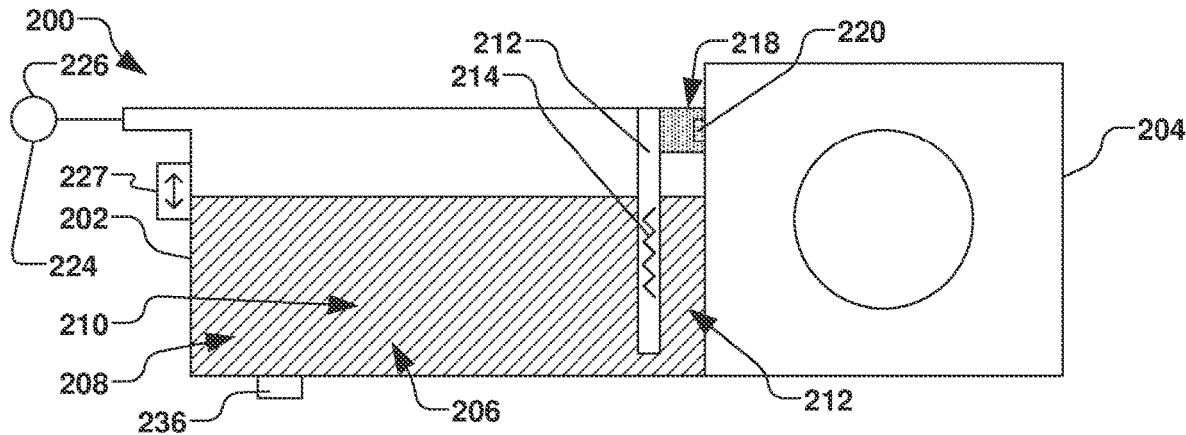
FIGS. 3A-3C are schematic representations of an ion source having a source material in various stages of introduction to a source chamber in accordance with various examples of the present disclosure.
Figure 3B:
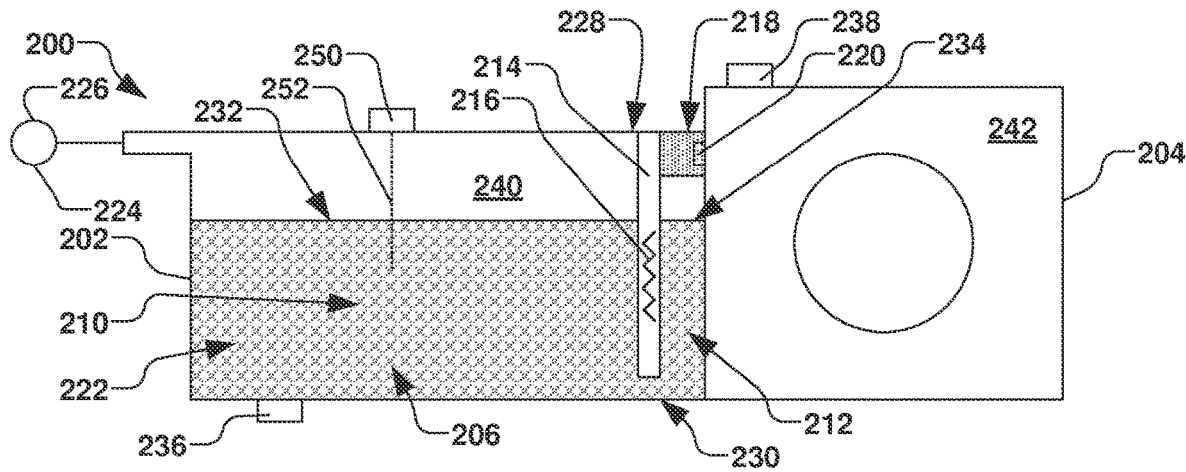
Figure 3C:
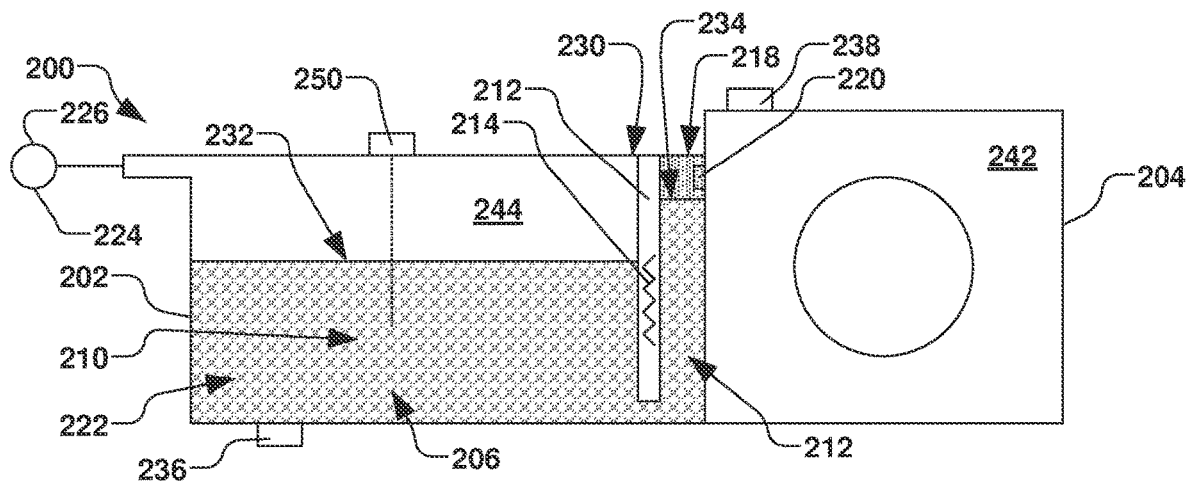

FIGS. 3A-3C illustrate a simplified example of an ion source 200 comprising a reservoir 202 (e.g., a crucible) operably coupled to an arc chamber 204 in accordance with various example aspects of the present disclosure. In operation, the reservoir 202 can be loaded with source material 206 at room temperature in FIG. 3A. The source material 206, for example, is supplied to the reservoir in a solid form 208 (e.g., a solid block, powder, granules, pellets, shot, etc.), wherein the source material comprises or is comprised of a desired element for implantation. The reservoir 202, for example, generally defines a first chamber 210 (e.g., a first volume) and a second chamber 212 (e.g., a second volume). In the present example, a divider 214 is disposed between the first chamber 210 and the second chamber 212. As illustrated in FIG. 3A, the first chamber 210 can be filled with the source material 206 in solid form 208 (e.g., pellets, powder, shot, etc.) that may spill over to the second chamber 212. The divider 214, for example, can comprise a heat source 216, such as an electrical heating element. The heat source 216 may be further provided separate from the divider 214. The heat source 216, for example, can be configured to selectively heat the source material 206 to between approximately 500-1000 deg C. Alternatively, when implanting ions from a source material 206 having a low melting temperature (e.g., gallium), the divider 214, for example, can comprise a fin having no heating element associated therewith. The second chamber 212 is fluidly coupled to the arc chamber 204 by a conduit 218, wherein in one example, the conduit comprises or contains a flow constricting device 220, such a capillary tube, limiting aperture, or a metallic mesh or porous structure.

While the reservoir 202 shown in FIGS. 3A-3C is illustrated as being directly coupled to the arc chamber 204, it is noted that the reservoir can be indirectly coupled to the arc chamber, whereby the reservoir is generally separated from the arc chamber, while still being fluidly coupled thereto via the conduit 218. For example, based on an orientation of reservoir 202 with respect to an orientation of the arc chamber 204, the conduit 218 may be an elongate channel, tube, and/or comprise one or more bends and runs. The heat source 216, for example, can be further configured to selectively heat the conduit 218, whereby the conduit can be further heated by a resistive or other heating device (not shown) that may be separate from the heating of the reservoir 202.

The heat source 216, for example, is configured to melt the source material 206 that is initially in the solid form 208 of FIG. 3A to transform the source material into a liquid form 222, as illustrated in FIG. 3B. In the present example, the first chamber 210 of the reservoir 202 is further fluidly coupled to a liquid control apparatus 224, such as a gas source 226, whereby the liquid control apparatus is configured to control a volume of the liquid defined the first chamber 210 of the reservoir 202, thus further controlling a volume of the liquid within second chamber 212 of the reservoir. The gas source 226, for example, can be initially evacuated and at a low pressure (e.g., 5 mtorr) prior to providing the gas the first chamber 210. While not shown, the liquid control apparatus 224 can alternatively comprise a gas box, another source of fluid, a bladder, hydraulic ram, elevator, or other mechanism configured to control the respective volumes within the reservoir 202.

In one example, the liquid control apparatus 224 can comprise an elevator mechanism 227 (e.g., one or more of a piston/cylinder arrangement, linear actuator, lever, or other mechanism) operably coupled to the reservoir 202, wherein the elevator mechanism is configured to selectively vary a vertical position of the reservoir with respect to the arc chamber 204 to define the predetermined supply of the source material 206 to the arc chamber due to gravitational force.

In one example, a gas such as argon or one or more other gases that do not chemically interact with the source material 206 is provided to the first chamber 210 of the reservoir 202 from the gas source 226. The divider 214, for example, generally divides the first chamber 210 from the second chamber 212 and extends from a top 228 of the reservoir 202 to approximately a bottom 230 of the reservoir, whereby the gas source 226 can selectively provide a pressure differential to lower a first level 232 of the source material 206 in the first chamber and to raise a second level 234 of the source material in the second chamber, as illustrated in FIG. 3C.

An accordance with one example, a temperature sensing device 236 is provided, wherein the temperature sensing device can be configured to monitor a temperature of the reservoir 202 or source material 206 for feedback in heating of the source material. In an alternative example, the heat source 216 can be configured to monitor or infer the temperature of the source material 206 in the reservoir 202.

In accordance with one example, a valve arrangement 238 is provided in association with the first chamber 210, the second chamber 212, and the arc chamber 204. The valve arrangement 238, for example, provides a first pressure 240 associated with the first chamber that can be equal to or slightly elevated from (e.g., approximately 0.1 torr or less) an arc chamber pressure 242 (e.g., vacuum) when melting the source material 206 from its solid form 208 of FIG. 3A to its liquid form 222 of FIG. 3B. The first chamber 210 can be in selective fluid communication with the arc chamber 204 such that the first chamber and arc chamber are at a common pressure when melting the source material 206 to its liquid form 222 shown in FIG. 3B. When the source material 206 is in its liquid form 222, the first chamber 210 can be held at a low pressure such that a pressure difference between the first chamber and the second chamber 212 has only a minor effect on the levels of the source material in either chamber.

As illustrated in FIG. 3C, the gas from the gas source 226 is provided at a second pressure 244 to the first chamber 210, wherein the second pressure is greater than the arc chamber pressure 242. The second pressure 244, for example, can range from 1-25 torr, however, the pressure can vary depending on various factures, such as a geometry of the reservoir 202, a location of the reservoir relative to the arc chamber 204, and a density of the source material 206 to its liquid form 222. Accordingly, a pressure differential between first chamber 210 and the second chamber 212 of the reservoir causes the level in the second chamber to rise relative to the level in the first chamber, and thus force the source material 206 through the conduit 218 and into the arc chamber 204.

The present disclosure appreciates that, for control purposes, unless a constant supply of gas is supplied to the first chamber 210 from the gas source 226, it can be advantageous to bleed a portion of the gas provided to the first chamber of the reservoir 202 to a pumping system (not shown), such that the second pressure 244 is automatically lowered. Further, the present disclosure contemplates various other apparatuses and methods for controlling and/or applying the first pressure 240 and second pressure 244 to the first chamber 210 of the reservoir. For example, if the first chamber 210 is maintained as a closed system, gas within the first chamber could be heated to increase from the first pressure 240 to the second pressure 244, or the volume of the first chamber 210 could be decreased to raise the pressure, such as via a bladder, syringe, moving or deformable wall (not shown), whereby hydraulic action provides the variation in pressure. Additionally, the reservoir 202, itself, could be physically moved vertically relative to the arc chamber 204, whereby the level of source material in the first chamber 210 is controlled by the positional height of the reservoir.

In an example where the source material 206 comprises gallium, a pressure differential of approximately 10 torr between the first chamber 210 and the second chamber 212 will cause a rise of approximately 40 mm in a liquid level in the second chamber. As the liquid form 222 of the source material 206 in its elemental form is significantly denser than gases commonly used for implantation source materials, a relatively low flow rate of the elemental source material of the present disclosure through the conduit is quite sufficient. For example, for gallium, a liquid flow rate of 3e-3 cc/min of liquid material introduces as much gallium to the arc chamber 204 as a gas flow of 5 sccm (hypothetical) of pure gallium in gaseous form. Thus, a reasonably-sized reservoir of interior dimensions of approximately 30 mm×30 mm×20 mm would contain enough material to provide a flow equivalent to 100 hours of gas flow at a flow rate of 5 sccm.

When it is desired to cease operation of the arc chamber 204, or when it is desired to change from a first species to a second species of the source material 206, the second pressure 244 shown in FIG. 3C in the first chamber 210 can be lowered, either by active pumping, or by selectively allowing the gas to bleed or vent to atmosphere or a vacuum environment in which the ion source 200 resides. As the pressure differential between first chamber 210 and second chamber 212 reduces, the liquid level in the second chamber is lowered, and the source material 206 is no longer fed through the conduit 218 to the arc chamber 204. Further, any source material 206 residing within the arc chamber 204, such as may be present within the cup 164 of FIG. 2, is thus permitted by gravity to return to the second chamber 212 of FIG. 3C.

The present disclosure further appreciates that it can be advantageous to measure an amount of the source material remaining in the reservoir 202. As such, one or more level sensors 250 can be provided, as illustrated in FIG. 3C. It should be noted that the one or more level sensors 250 can be provided in association with one or more of the first chamber 210 and second chamber 212 for measuring respective levels of the source material 206, therein. The one or more level sensors 250, for example, can comprise one or more electrically conductive probes 252 extending into the source material 206 in the first chamber 210. Based, at least in part, on a length of each respective probe 252, electrical continuity, resistance, or capacitance can be measured between the respective probe and source material 206. For example, a single probe 252 extending proximate to the bottom 230 of the reservoir 202 can be utilized to simply determine a "low" or "empty" level of the source material 206 within the reservoir, while multiple probes of varying lengths can be utilized to determine a range of levels of the source material within the reservoir.

Figure 4A:
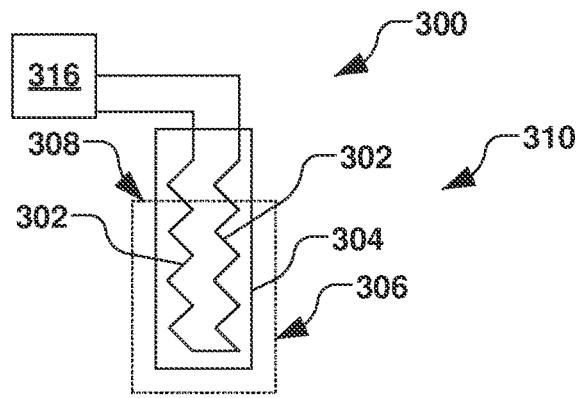
FIGS. 4A-4C are schematic representations of a level sensor a reservoir in accordance with various examples of the present disclosure.
Figure 4B:
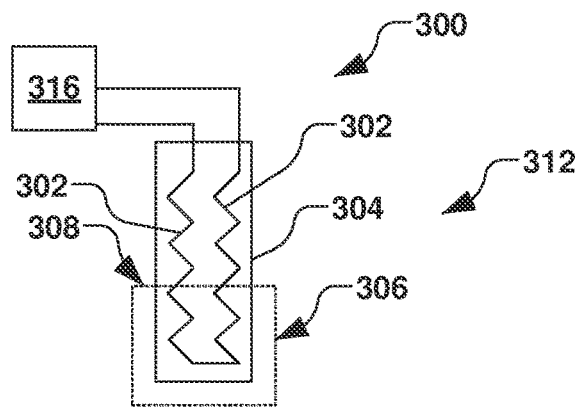
Figure 4C:
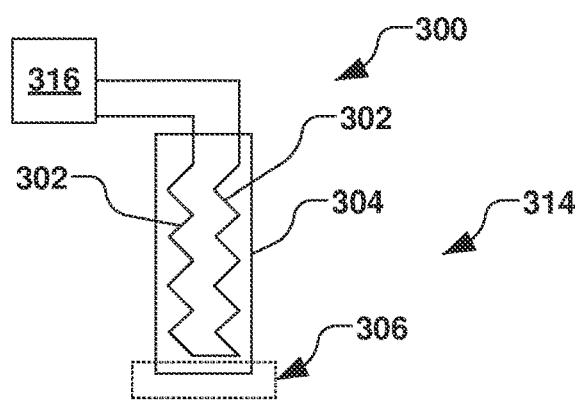

In another example, for a source material 206 that is electrically-conductive, a level sensor 300 is illustrated in FIGS. 4A-4C, whereby two parallel electrically conductive traces 302 are deposited onto an insulating refractory material 304, such as alumina or boron nitride. A variation in the level of a source material 306 will electrically short the traces 302 when the traces are below a surface 308 of the source material, thus lowering a resistance below that of the trace, itself. For example, FIG. 4A illustrates the source material 306 in contact with the traces 302, thus indicating an full level 310, FIG. 4B illustrates a low level 312 of the source material contacting the traces, and FIG. 4C illustrates an empty level 314 of the source material. As the level of the source material 306 is lowered, a resistance 316 measured between the traces 302 will increase to a value associated with the empty level 314. The resistance 316, for example, may be based on the temperature and source material 306 utilized, but will be a repeatable function for a given material. For example, the level sensor 300 of FIGS. 4A-4C would be suitable for electrically conductive materials such as Ga, In, Sn, Zn, Sb, Al, La, and Pb.

Figure 5:
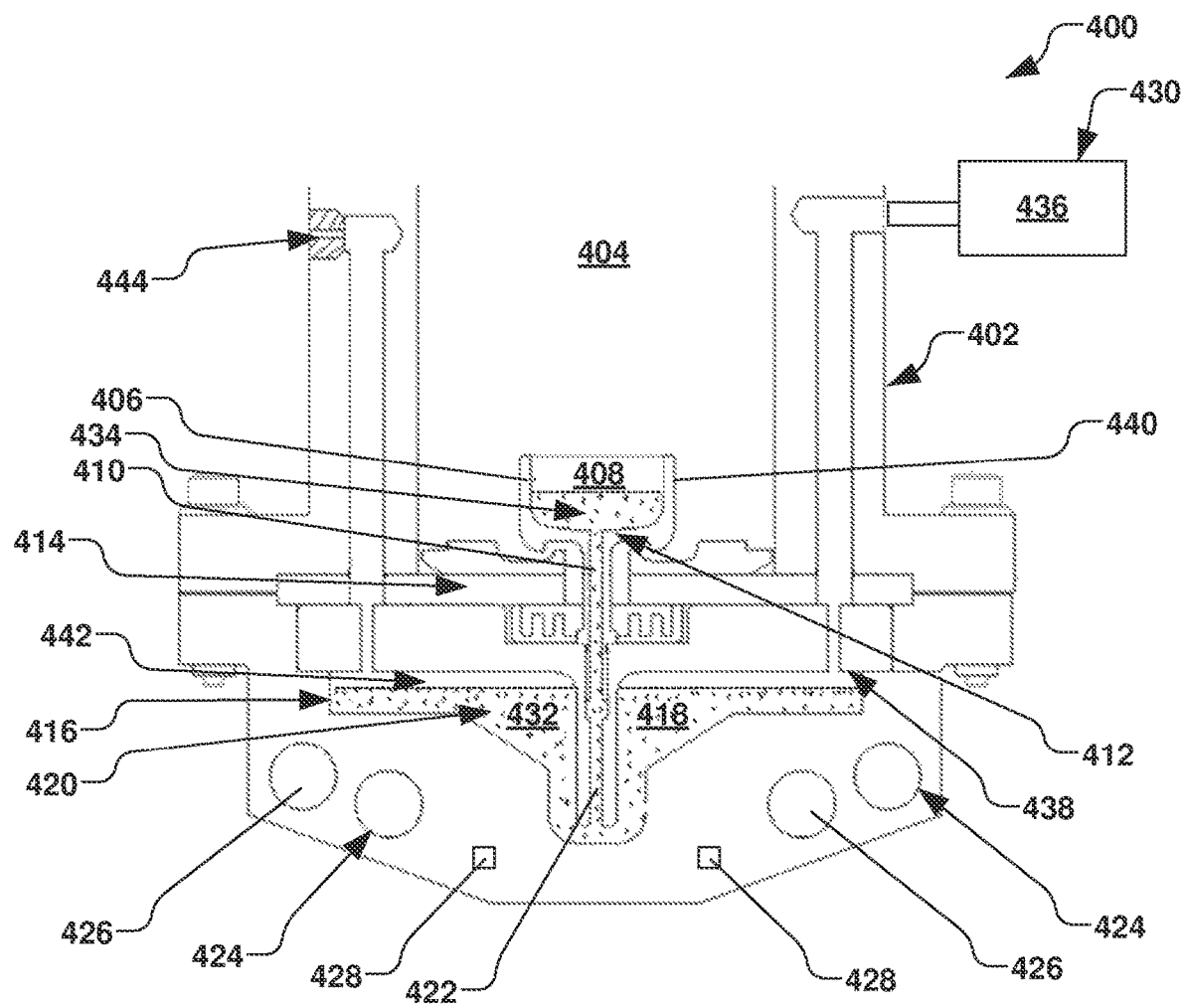
FIG. 5 is a partial cross section of an ion source in accordance with various examples of the present disclosure.

The present disclosure further contemplates various arrangements of the reservoir in a myriad of structures. For example, while the reservoir 202 shown in FIGS. 3A-3C is illustrated schematically as one example, other structures are contemplated, such as the first and second chambers 210, 212 being arranged concentrically, as illustrated in FIG. 5. It should be noted, however, that all structures provided herein are but only several examples of those contemplated, and that the present disclosure considers various other structural configurations of an arc chamber and ion source to further fall within the scope of the present disclosure.

As illustrated in FIG. 5, for example, an ion source 400 is illustrated, wherein an arc chamber 402 generally defines an arc chamber volume 404. A cup 406, for example, is positioned within the arc chamber 402, wherein the cup defines a cup volume 408. The cup 406, for example, comprises a stem 410 extending from a bottom surface 412 of the cup through a wall 414 of the arc chamber 402.

Further, a reservoir 416 is operably coupled to the arc chamber 402, wherein the reservoir 416 generally defines a reservoir volume 418. The reservoir volume 418, for example, is configured to contain a source material 420 therein, wherein the source material is initially in a solid form. A conduit 422, for example, is defined in the stem 410, wherein the conduit fluidly couples the reservoir volume 418 to the arc chamber volume 404 via the cup volume 408.

A heat source 424, for example, is in thermal communication with the reservoir 416, wherein the heat source is configured to selectively heat the reservoir, whereby the heat source is configured to transform and/or maintain the source material 420 into a liquid form. The heat source 424, for example, can comprise one or more electrical heaters 426 operably coupled to the reservoir 416. The one or more electrical heaters 426, for example, can comprise one or more cartridge heaters embedded in the structure of reservoir 416, whereby the reservoir can be comprised of one or more of graphite, boron nitride, alumina, tungsten, or another refractory material. Further, one or more thermocouples 428 can be provided in thermal contact with the reservoir 416 to provide control of the heat source 424.

A liquid control apparatus 430, for example, is further operably coupled to the reservoir 416, wherein the liquid control apparatus is configured to control a first volume 432 of the source material 420 in liquid form that is defined within the reservoir volume 418. The first volume 432 of the source material 420 in liquid form within the reservoir volume, being controlled by the liquid control apparatus 430, further defines a second volume 434 of the source material within the cup volume 408.

The liquid control apparatus 430, for example, comprises a pressurized gas source 436 fluidly coupled to the reservoir 416, wherein the pressurized gas source is configured to selectively supply a gas to the reservoir at a predetermined pressure. The predetermined pressure provided by the pressurized gas source 436, for example, defines the first volume 432 of the liquid within the reservoir volume 418, thus further defining the second volume 434 of the liquid within the cup volume 408. As such, a level of the source material 420 within the cup 406 is based, at least in part, on the predetermined pressure provided by the pressurized gas source 436.

The pressurized gas source 436, for example, can provide argon or another gas may through the top portion 438 of the reservoir 416, thus forcing the source material 420 through the conduit 422 and into the arc chamber volume 404, where the source material defines the second volume 434 within the cup 406. The cup 406, for example, can comprise a repeller 440, as discussed above. An area of the cup 406 defining the top surface of the second volume 434, for example, can be sized to maximize an available beam current associated with the ion implantation.

Additionally, the reservoir 416 and repeller 440 can be electrically isolated from a remainder of the arc chamber 402 and biased relative to the arc chamber. Accordingly, heating of the repeller 440 by ions from the plasma can further advantageously control heating of the source material 420 within the arc chamber 402, whereby the present disclosure provides multiple sources of heat to the source material.

The present disclosure further appreciates that controlling a size (e.g., a length and diameter) of the conduit 422, for example, can provide a further control of a flow of the source material 420 therethrough. Further, the present disclosure appreciates that a static pressure can be implemented in the pressurized gas source 436 to control the level of the source material 420 within the cup 406. However, a dynamic system may alternatively be implemented, whereby a gas is continuously fed through the top portion 438 of the reservoir 416, and wherein the gas is further permitted to exit the through head space 442 and through the arc chamber 402 to an orifice 444 to be pumped away. The orifice 444 can be sized to controllably maintain the pressure over a range of up to 100 torr in the head space 442 while maintaining the gas flows to levels less than 10 sccm. Alternatively, a needle valve (not shown) can be provided with the pressurized gas source to further control the flow of gas, and thus, control the pressure and level of the source material in the reservoir 416.

The present disclosure thus provides a source material to an arc chamber of an ion implantation system, whereby the source material is provided as a liquid or as a solid and melted into a liquid form. The system and apparatus of the present disclosure permits expeditious introduction and removal of the liquid with respect to the plasma chamber, thus improving throughput, reducing cross-contamination, and reducing source material waste.

Figure 6:
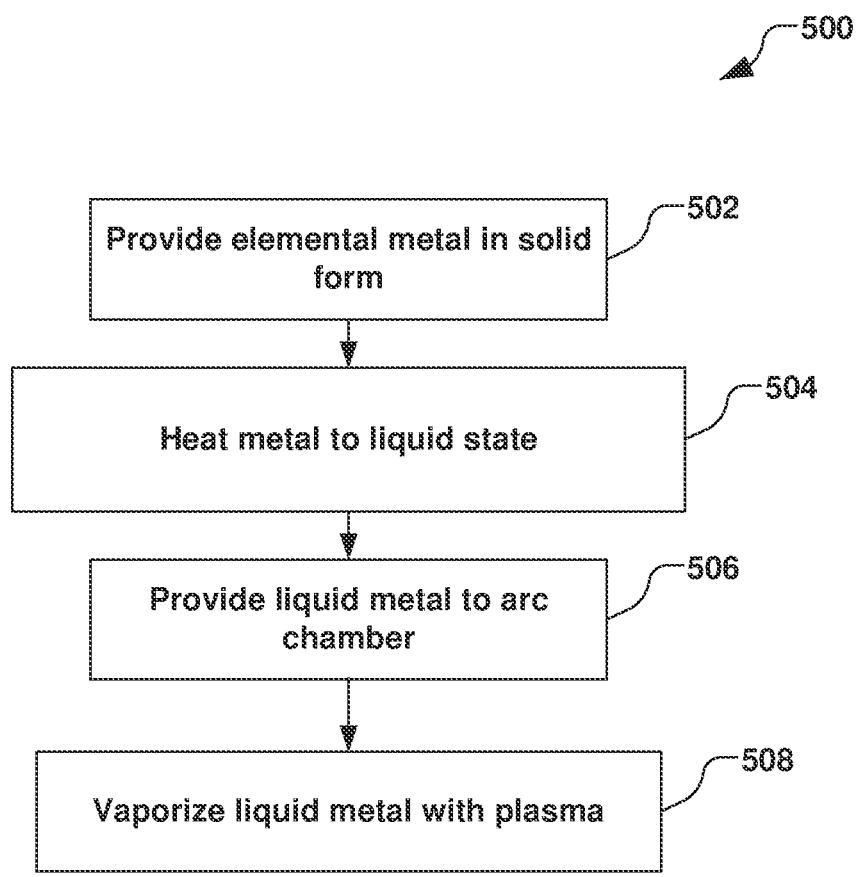
FIG. 6 is a flowchart illustrating an example method for forming ions from a solid source material according to another example of the present disclosure.

In accordance with another exemplary aspect, a method 500 is provided in FIG. 6 for providing a liquid metal to an ion source for forming an ion beam for an ion implantation into a workpiece. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

It should be noted that the controller 138 of FIG. 1 may be configured to perform the method 500 of FIG. 6, whereby control of various components discussed above may be achieved in the manner described herein. As illustrated in FIG. 6, the exemplified method 500 begins at act 502, wherein a material, such as a metal in elemental form, is provided to an ion source in solid form. The metal can be in a powder or other solid form. The metal, for example, is provided to a cup of a reservoir apparatus positioned inside an arc chamber, as described above in several examples.

In act 504, the metal is heated to a liquid state, and in act 506, the liquefied metal is provided to an interior region of the arc chamber. Acts 504 and 506 may be performed sequentially or concurrently in various orders. In one example, the metal may be heated to the liquid state external to the arc chamber in act 504 and subsequently provided to the interior region of the arc chamber in act 506. In act 508, the liquid metal is vaporized to form a plasma.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion source for an ion implantation system, the ion source comprising:
    an arc chamber defining an arc chamber volume;
    a reservoir in fluid communication with the arc chamber and defining a reservoir volume, wherein the reservoir volume is configured to contain a dopant source material therein; and
    a liquid control apparatus operably coupled to the reservoir, wherein the liquid control apparatus is configured to control an amount of the dopant source material within the arc chamber volume by selective control of a hydrostatic pressure of the dopant source material within the reservoir volume.

2. The ion source of claim 1, wherein the liquid control apparatus comprises a gas source fluidly coupled to the reservoir and configured to selectively supply a gas to the reservoir to control the hydrostatic pressure of the dopant source material within the reservoir volume.

3. The ion source of claim 2, wherein the liquid control apparatus further comprises:
    a gas bleed orifice defining a predetermined fluid conductance between the reservoir volume and an external environment; and
    a gas flow controller configured to control a flow rate of the gas to the reservoir, wherein the control of the flow rate and the predetermined fluid conductance selectively controls the hydrostatic pressure of the dopant source material within the reservoir volume.

4. The ion source of claim 3, wherein the predetermined fluid conductance is less than approximately 1 sccm.

5. The ion source of claim 1, further comprising a heat source in thermal communication with the reservoir, wherein the heat source is configured to selectively heat the reservoir.

6. The ion source of claim 5, wherein the heat source is further configured to melt the dopant source material from a solid state to a liquid state, whereby the dopant source material is in the liquid state concurrent with the selective control of the hydrostatic pressure of the dopant source material within the reservoir volume.

7. The ion source of claim 5, wherein the heat source is associated with a plasma within the arc chamber volume.

8. The ion source of claim 1, wherein the reservoir is configured to contain the dopant source material a solid state and a liquid state.

9. An ion source for an ion implantation system, the ion source comprising:
    an arc chamber defining an arc chamber volume;
    a reservoir defining a reservoir volume, wherein the reservoir volume is configured to contain a dopant material therein, and wherein the reservoir volume is in fluid communication with the arc chamber volume; and
    a liquid control apparatus operably coupled to the reservoir, wherein the liquid control apparatus is configured to control a first volume of the dopant material in a liquid state defined within the reservoir volume, and wherein the first volume of the dopant material further defines a predetermined supply of the dopant material to the arc chamber volume, and wherein the liquid control apparatus is configured to control an amount of the dopant material within the arc chamber volume by selective control of a hydrostatic pressure of the dopant material within the reservoir volume.

10. The ion source of claim 9, further comprising a heat source in thermal communication with the reservoir, wherein the heat source is configured to selectively heat the reservoir.

11. The ion source of claim 10, wherein the reservoir is configured to contain the dopant material a solid state and the liquid state.

12. The ion source of claim 11, wherein the heat source comprises a heater configured to melt the dopant material from the solid state to the liquid state within the reservoir volume.

13. The ion source of claim 10, wherein the heat source is configured to maintain the dopant material in the liquid state.

14. The ion source of claim 13, wherein the heat source is associated with a plasma within the arc chamber volume.

15. The ion source of claim 9, further comprising a cup positioned within the arc chamber, wherein the cup defines a cup volume configured to contain the dopant material within the arc chamber.

16. An ion source for an ion implantation system, the ion source comprising:
   an arc chamber defining an arc chamber volume;
   a reservoir in fluid communication with the arc chamber and defining a reservoir volume, wherein the reservoir volume is configured to contain a dopant material therein;
   a heater configured to melt the dopant material from a solid state to a liquid state within the reservoir volume; and
   a liquid control apparatus operably coupled to the reservoir, wherein the liquid control apparatus is configured to control an amount of the dopant material in the liquid state within the arc chamber volume by selective control of a hydrostatic pressure of the dopant material within the reservoir volume.

17. The ion source of claim 16, wherein the liquid control apparatus comprises a gas source fluidly coupled to the reservoir and configured to selectively supply a gas to the reservoir to control the hydrostatic pressure of the dopant material within the reservoir volume.

18. The ion source of claim 17, wherein the liquid control apparatus further comprises:
   a gas bleed orifice defining a predetermined fluid conductance between the reservoir volume and an external environment; and
   a gas flow controller configured to control a flow rate of the gas to the reservoir, wherein the control of the flow rate and the predetermined fluid conductance selectively controls the hydrostatic pressure of the dopant material within the reservoir volume.

19. The ion source of claim 18, wherein the gas flow controller is further configured to control a pressure differential between the reservoir volume and the external environment.

* * * * *